(12) United States Patent
Chen

(10) Patent No.: US 7,261,143 B2
(45) Date of Patent: Aug. 28, 2007

(54) HEAT PIPE

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/198,103

(22) Filed: Aug. 5, 2005

(65) Prior Publication Data
US 2006/0042786 A1    Mar. 2, 2006

(30) Foreign Application Priority Data
Sep. 1, 2004  (CN) .................. 2004 1 0051348

(51) Int. Cl.
*F28D 15/00* (2006.01)
*H05K 7/20* (2006.01)

(52) U.S. Cl. .................. 165/104.26; 165/104.21; 165/104.33

(58) Field of Classification Search ........... 165/104.21, 165/104.26, 133, 179, 183, 184, 109.1; 29/890.032; 361/700; 252/71; 977/932, 962, 963
See application file for complete search history.

(56) References Cited

U.S. PATENT DOCUMENTS

| | | | |
|---|---|---|---|
| 4,004,441 A | | 1/1977 | Leszak |
| 4,044,797 A | * | 8/1977 | Fujie et al. .................. 138/38 |
| 4,353,415 A | * | 10/1982 | Klaschka et al. ...... 165/104.21 |
| 5,219,021 A | * | 6/1993 | Edelstein et al. ...... 165/104.26 |
| 6,432,320 B1 | * | 8/2002 | Bonsignore et al. .......... 252/70 |
| 6,766,817 B2 | | 7/2004 | da Silva |
| 6,960,243 B1 | * | 11/2005 | Smith et al. .................. 95/117 |
| 6,982,787 B1 | * | 1/2006 | Wapner et al. .............. 356/138 |
| 2004/0069461 A1 | * | 4/2004 | Yuyama et al. ........ 165/104.26 |
| 2004/0194944 A1 | * | 10/2004 | Hendricks et al. .......... 165/181 |
| 2005/0011572 A1 | * | 1/2005 | Belcher .................... 138/137 |
| 2005/0238810 A1 | * | 10/2005 | Scaringe et al. ......... 427/249.1 |
| 2006/0005951 A1 | * | 1/2006 | Yeh et al. .............. 165/104.26 |

FOREIGN PATENT DOCUMENTS

JP          04098093 A   *   3/1992

* cited by examiner

*Primary Examiner*—Tho Duong
(74) *Attorney, Agent, or Firm*—Jeffrey T. Knapp

(57) ABSTRACT

A heat pipe includes a metal tube and an amount of fluid sealed in the copper tube. The metal tube may include an inner surface. The inner surface is patterned to define at least one pitch and at least two grooves. A given pitch separates adjacent grooves. The amount of fluid may include a liquid and carbon nanotubes, carbon nanocapsules and/or metal nanoparticles suspended therein.

20 Claims, 4 Drawing Sheets

HEAT PIPE

FIELD OF THE INVENTION

The present invention relates to a thermal device and, particularly, to a heat pipe.

BACKGROUND OF THE INVENTION

A heat pipe is a device that has an extremely high thermal conductivity and that is used to transport heat. In order to achieve this, heat pipes take advantage of simple physical effects:

As a liquid evaporates, energy—in the form of heat—must be taken from the environment. Therefore, an evaporating liquid will cool the surrounding area. This is how a heat pipe effectively cools the heat source. However, this doesn't get rid of the heat; heat is just transported with the vapor. At the target side for heat transport, the heat pipe must be cooled, for example using a heat sink. Here, the inverse effect takes place: the liquid condenses and, therefore, emits heat. Using these effects, it is possible to build heat pipes that have a thermal conductivity that is many thousand times higher than a copper piece of the same size.

FIG. 11 (prior art) is a schematic view of a heat pipe 10. Referring to FIG. 11, the heat pipe 10 includes a closed metal tube 12 filled an amount of working fluid 18a, 18b. The heat pipe 10 further includes a heat sink 14 mounted on an upper side of the closed metal tube 12. If a heat source 16 is applied to the lower side, the working fluid 18a will evaporate, while cooling the heat source 16. The working fluid 18a will move up and condense near the heat sink 14 on top. From there, the working fluid 18b will drip back to the heat source 16. Such working fluid 18b drips with the help of gravity, so this heat pipe 10 works in only vertical orientation.

What is needed, therefore, is a heat pipe which may not rely on gravity alone to move a working fluid to a heat source.

SUMMARY OF THE INVENTION

A heat pipe of the present invention, in one form thereof, may include a metal (e.g., copper) tube, an amount of liquid and a nano material. The metal tube has tube inner surface and a tube interior. The inner surface is patterned by a reactive ion etch technique and a lithography technique, so that the inner surface of the copper tube defines at least one pitch and at least two grooves (e.g., V-shaped). The grooves are separated by the pitch and are respectively elongated along the metal tube. The amount of liquid is carried in the tube interior, and the nano material is admixed in the amount of liquid.

Each of the grooves can have a bottom at which a given groove forms an angle in the range of about 45 to about 90 degrees.

Preferably, each of the grooves has a depth in the range of about 10 nanometers to about 1 micrometer. Each of the grooves has an upper width in the range of about 10 nanometers to about 1 micrometer. The pitch has a width in the range of about 20 nanometers to about 1 micrometer.

The amount of liquid, in the metal tube, may advantageously be comprised of a liquid selected from the group consisting of water, ammonia, methanol, acetone and heptane. The nano material, carried in the amount of liquid, may usefully be comprised of a material selected from the group consisting of carbon nanotubes, carbon nanocapsules, copper nanoparticles, and another metallic nano material.

The grooves of the metal tube provide a capillary driving force. The capillary driving force drives a working fluid to the heat source. Accordingly, such a metal tube may not need to rely on gravity alone to move the working fluid to a heat source. The heat pipe including such a metal tube may work in not only vertical orientation but also in a horizontal or angular orientation.

Other advantages and novel features of the present invention will be drawn from the following detailed description of preferred embodiments of the present invention together with the attached drawings, in which:

DETAILED DESCRIPTION OF PREFERRED EMBODIMENTS

Figure 9:
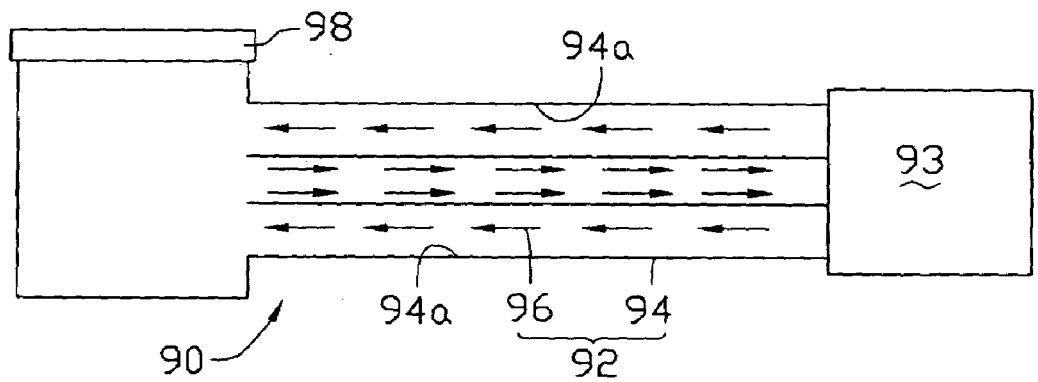
FIG. 9 is a schematic view of a thermal assembly according to a first embodiment of the present invention.
Figure 10:
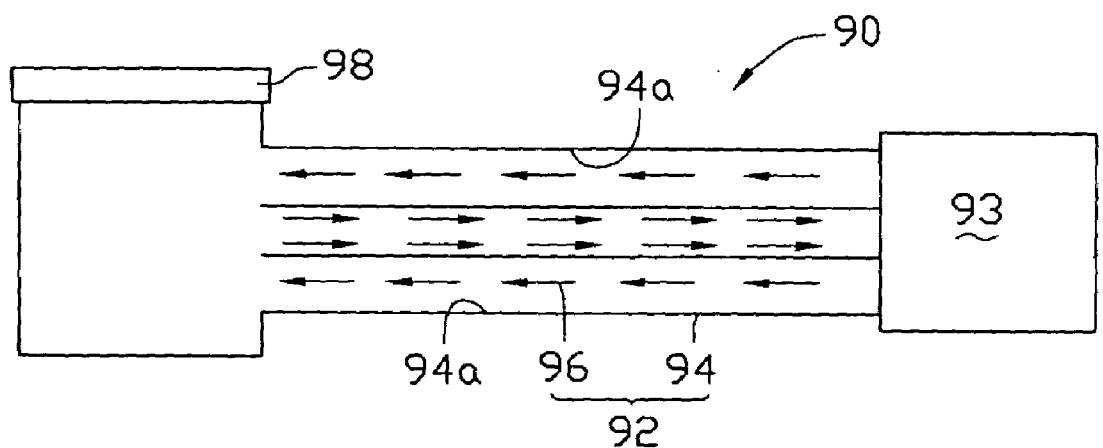
FIG. 10 is a schematic view of a thermal assembly according to a second embodiment of the present invention.
Figure 11:
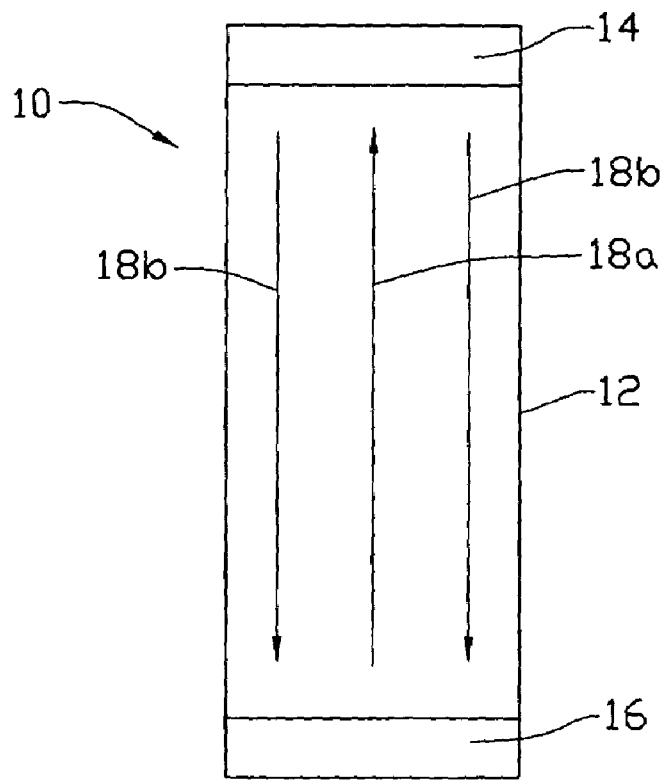
FIG. 11 is a schematic view of a conventional heat pipe.

In a first embodiment, referring FIGS. 9 and 10, a thermal assembly 90 may generally be composed of a heat pipe 92, a central processing unit 98, and a heat sink 93. Futher, the heat pipe 92 may generally include a metal tube (e.g., copper) 94 and an amount of fluid 96 sealed in the metal tube 94. The metal tube 94 may usefully be composed of copper or an alloy thereof or, alternatively, be a metal tube made of a metal such as aluminum, iron or stainless steel. Advantageously, the material chosen for metal tube 94 is readily formable, has good thermal conductivity, and is generally corrosion resistant.

Figure 2:
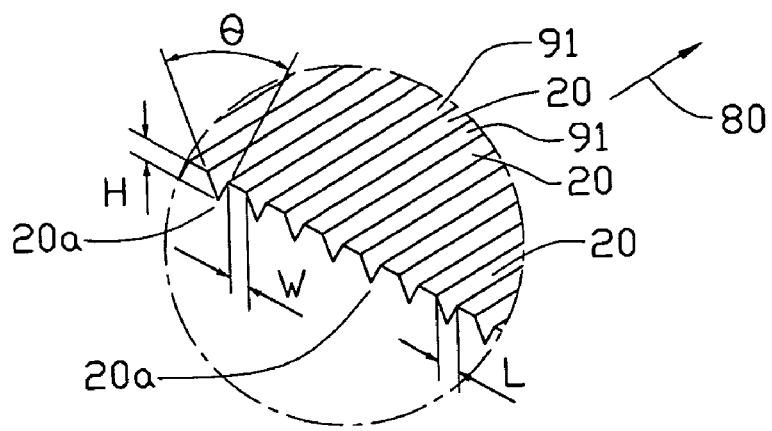
FIG. 2 is an enlarged, schematic view of a section II of the metal plate of FIG. 1, wherein each of the V-shaped grooves is elongated along a first direction.

The metal tube 94 has an inner surface 94a. Referring also to FIG. 2, the inner surface 94a may be patterned to define at least one pitch 91 and at least two grooves 20. A given pitch 91 may separate adjacent grooves 20. The grooves 20 may be, for example, screw threads on the inner surface 94a of the metal tube 94.

Preferably, the inner surface 94a of the metal tube 94 includes at least two pitches 91 (FIG. 2). The pitches 91 and the grooves 20 may collectively encircle the amount of fluid 96 (FIG. 10). Each of the grooves 20 is illustrated to be V-shaped but may be alternatively (not shown) U-shaped, rectangular, curve or step-shaped. If each of the grooves 20 is step-shaped, each step-shaped groove may have an inverted-trapezoid shape.

Referring to FIG. 9, the amount of liquid 96 is advantageously carried within the metal tube 94 to aid in heat exchange. The amount of fluid 96 may be comprised of a liquid selected from the group consisting of water, ammonia, methanol, acetone and heptane. Furthermore, the amount of fluid 96 can be a fluid (e.g., a liquid suspension) carrying a heat-conductive nano material therein. The nano material can advantageously be selected from the group consisting of carbon nanotubes, carbon nanocapsules and copper nanoparticles. In addition to carbon and/or copper nano materials, potentially other metal or suitably conductive nano materials could be employed and still be within the scope of the invention.

The metal tube 94 of heat pipe 92 has a tube inner surface 94a. The inner surface 94a can advantageously be patterned by a reactive ion etch technique and a lithography technique, used in combination. As a result, the inner surface 94a of the metal tube 94 defines at least one pitch 91, as shown in FIG. 2. It is further understood that any forming process which would yield the desired groove pattern within tube inner surface 94a could be employed and be within the scope of this invention.

Referring also to FIG. 2, the inner surface 94a of the metal tube 94 further defines at least two grooves 20 separated by the pitch 91. The grooves 20 are respectively elongated along the metal tube 94.

Still referring to FIG. 2, each of the grooves 20 has a bottom 20a. Preferably, each of the grooves 20 forms a groove angle θ in the range of about 45 to about 90 degrees at each groove bottom 20a. Each of the grooves 20 may have a groove depth H in the range of about 10 nanometers to about 1 micrometer. Each of the grooves 20 may have an upper groove width L in the range of about 10 nanometers to about 1 micrometer. The groove pitch 91 may have a pitch width W in the range of about 20 nanometers to about 1 micrometer.

The central processing unit 98 is arranged to be cooled by the amount of fluid 96 carried in the metal tube 94. The heat sink 93 is for cooling the amount of fluid 96 after the amount of fluid 96 cools the central processing unit 98 (i.e., the heat source).

Figure 1:
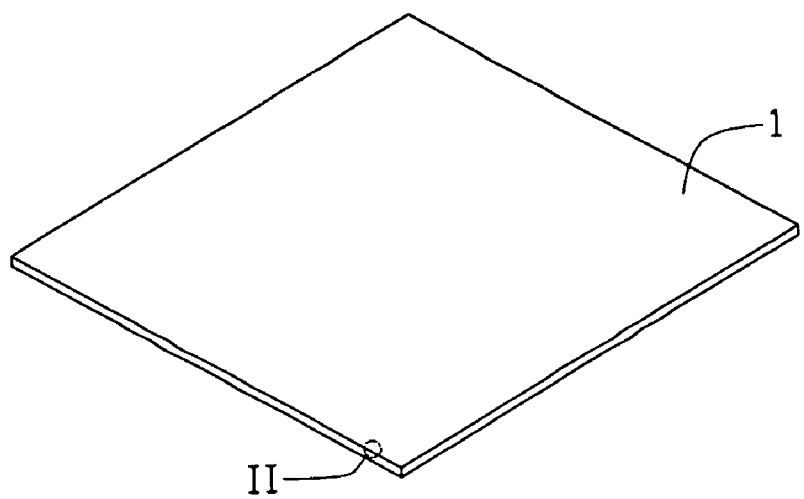
FIG. 1 is a schematic view of a metal plate to be used in forming a heat pipe of the present invention, the metal plate having a number of V-shaped grooves thereon according to a first embodiment of the present invention.

In an additional embodiment, a method is provided to pattern the inner surface 94a of the metal tube 94. The method includes a process of transferring a pattern onto a metal plate 1 (FIG. 1) by the combined use of reactive ion etch technique and the lithography technique. The transfer process (not illustrated) includes a step of forming a stamper by the reactive ion etch technique and the lithography technique. The stamper is formed to have the desired groove pattern.

The stamper may be formed, for example, as follows (process not shown). A pattern is designed. The designed pattern corresponds to a pattern of one or more grooves 20 in the metal tube 94. A silicon substrate is provided. A photoresist layer is coated on the silicon substrate. The coated photoresist layer serves as a mask on the silicon substrate. The mask is exposed and developed by the lithography technique. The mask is then partially removed, thereby partially exposing the silicon substrate. The exposed silicon substrate has the designed pattern. A gold film is formed on the exposed silicon substrate. Such formed gold film has the designed pattern serving as the pattern of a groove 20. A layer of nickel is electroformed over the gold film and the silicon substrate. The silicon substrate is removed by being immersed in a base solution of potassium hydroxide. The mask is removed by the reactive-ion-etch technique. After such a removing step, the layer of nickel and the gold film collectively serve as the stamper.

Alternatively, the stamper can be formed as follows (process not illustrated). A pattern is designed. The designed pattern corresponds to a pattern of a groove 20. A nickel substrate is provided. A photoresist layer is coated on the nickel substrate. The coated photoresist layer serves as a mask on the nickel substrate. The mask is exposed and developed by the lithography technique of the second embodiment. The mask is then partially removed, thereby partially exposing the nickel substrate. Such a mask exposes the nickel substrate. The exposed nickel substrate has the designed pattern serving as the pattern of a groove 20. The nickel substrate and the mask collectively serve as the stamper.

The process of transferring the pattern onto the metal plate may further include a printing step (not shown). In such step, the pattern of the stamper is printed onto the metal plate 1. The pattern is printed by a nano-imprinting technique or alternatively by a hot-embossing technique. In the hot-embossing technique, the pattern of the stamper may be printed as follows. An embossing material is coated on the metal plate 1. The metal plate 1 is heated to soften the embossing material. The stamper is pressed onto the soft embossing material. The soft embossing material partially exposes the metal plate 1 after the stamper is removed. The metal plate 1 is etched to define the V-shaped grooves of the second embodiment. This etching step may be achieved by using such a soft embossing material as an etching mask.

Figure 3:
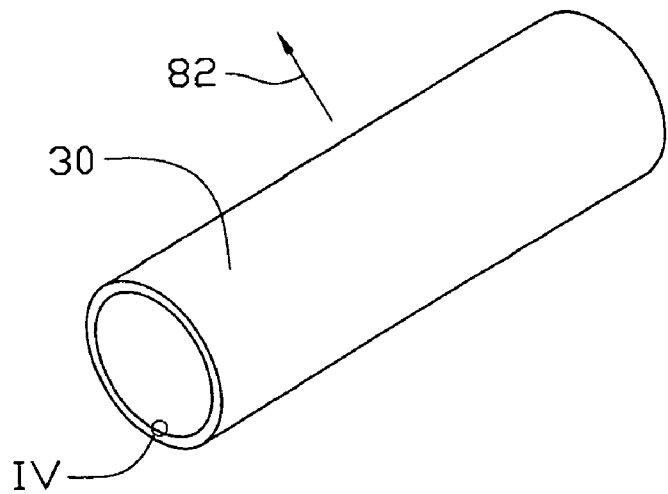
FIG. 3 is a schematic view of a metal tube formed by rolling up and welding the metal plate of FIG. 1, wherein the metal plate is rolled up along a second direction vertical to the first direction.
Figure 4:
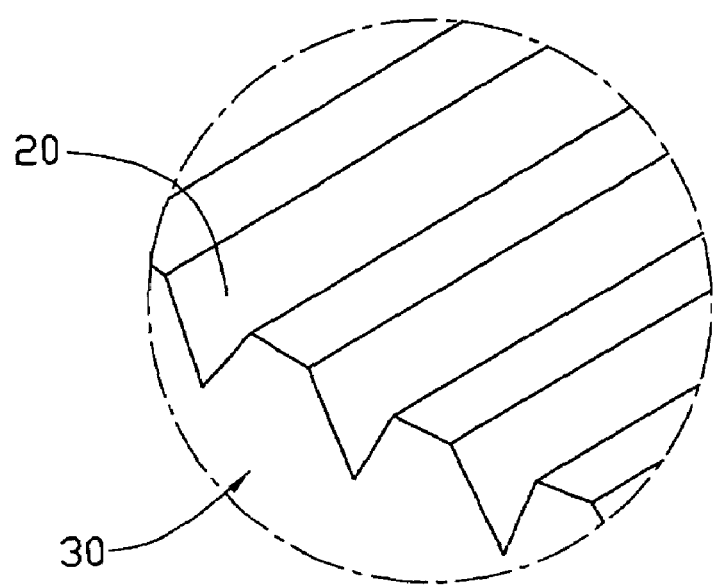
FIG. 4 is an enlarged, schematic view of a section IV of the metal tube of FIG. 3.

Referring to FIG. 3, the metal plate 1 (FIG. 1) having the grooves 20 (FIG. 4) is molded to form a metal tube 30. The metal tube 30 includes the grooves 20, as those on an inner surface 94a (FIG. 9) of the metal tube 94 (FIG. 9). The molding method includes a step of rolling up the metal plate 1. The molding method may further include a process of welding and sealing the boundaries of the metal plate 1. The welding process may be, for example, a vacuum sealing process. In such a process, an inert gas is provided for welding. The inert gas includes argon, neon and/or krypton.

Referring also to FIG. 2, each of the grooves 20 are elongated and extend along first or tube direction 80. In the step of rolling up the metal plate 1 (FIG. 1), the metal plate 1 may be rolled up along a second direction 82. The second direction 82 may be perpendicular to the first direction 80, as shown in FIG. 3.

Figure 5:
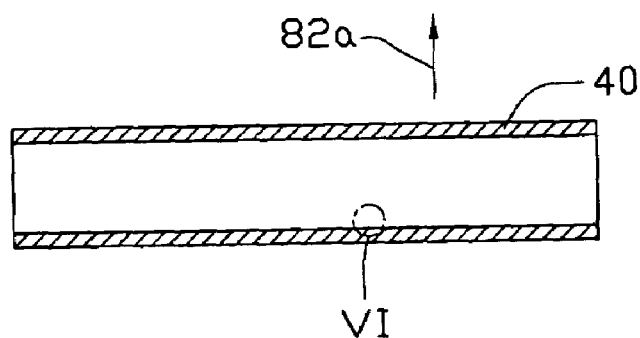
FIG. 5 is a cross-sectional, schematic view of a metal tube formed by rolling up and welding the metal plate of FIG. 1, wherein the metal plate is rolled up along a second direction parallel with the first direction.
Figure 6:
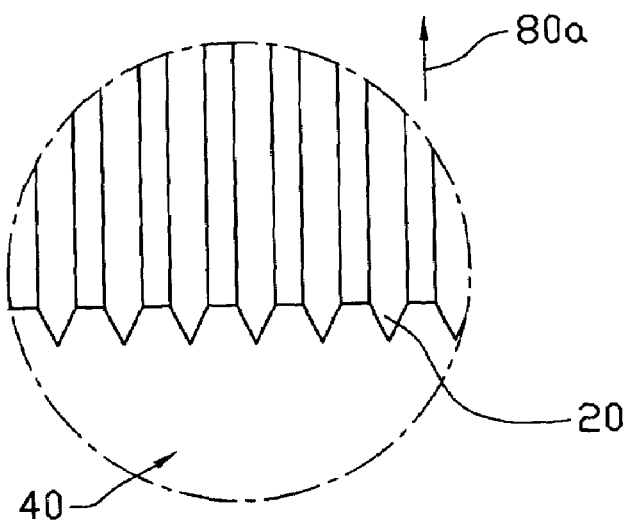
FIG. 6 is an enlarged, schematic view of a section VI of the metal tube of FIG. 5.

Alternatively, the second direction 82 may be parallel with the tube direction 80. Referring to FIG. 5 and FIG. 6, each of the grooves 20 extends along a first direction 80a. In the step of rolling up the metal plate 1 (FIG. 1), the metal plate 1 may be rolled up along a second direction 82a. The second direction 82a is parallel with the first direction 80a, as shown in FIG. 5 and FIG. 6.

Figure 7:
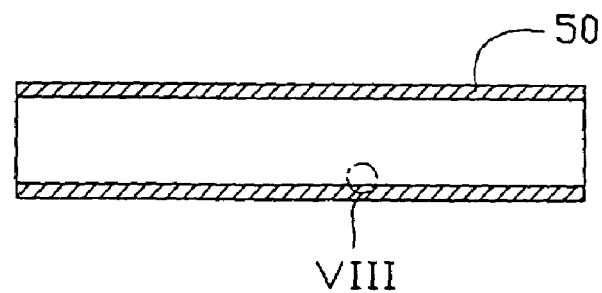
FIG. 7 is a schematic view of a metal tube formed by rolling up and welding the metal plate of FIG. 1, wherein the metal plate is rolled up along a second direction, and wherein the second direction and the first direction form a first angle in the range between 0 and 90 degrees.
Figure 8:
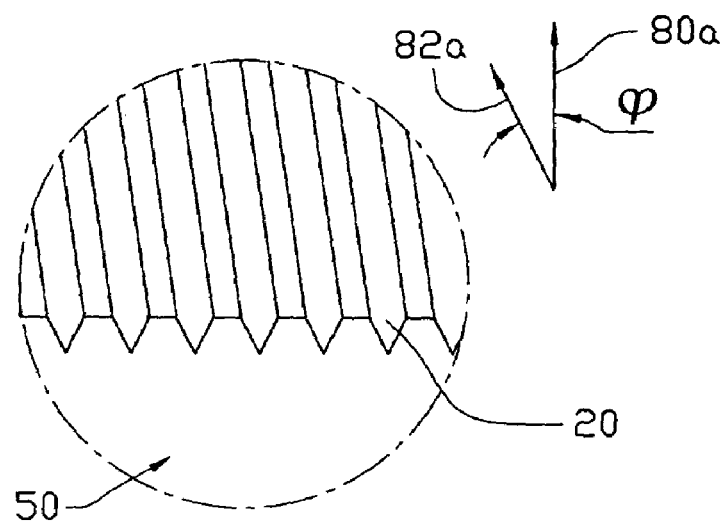
FIG. 8 is an enlarged, schematic view of a part of the metal tube of FIG. 7.

In addition to the parallel mode and the perpendicular mode, the second direction 82a and the first or tube direction 80a may alternatively be at a first angle relative to one another. The first angle may be in the range between 0 and 90 degrees. In this case, referring FIG. 7 and FIG. 8, each of the grooves 20 of the metal tube 50 may be tilted at a second angle. The second angle is identical to the first angle.

Referring to FIG. 9, the metal tube 94 surrounds an amount of air. The air is drawn out, thereby evacuating the metal tube 94. A suitable amount of fluid 96 is then added into in the metal tube 94. The amount of fluid 96 may advantageously be (e.g., a liquid or liquid suspension) comprised of liquid selected from the group consisting of water, ammonia, methanol, acetone and heptane.

A number of particles may be included in the amount of fluid 96. The particles may be made of a conductive material, for increasing the thermal conductivity of the amount of fluid 96. Such particles may be suspended in the amount of liquid. The suspended particles and the amount of liquid together, in this instance, serve as the working fluid 96 of the heat pipe 92. The suspended particles may be, for example, carbon nanotubes, carbon nanocapsules and/or copper nanoparticles. The carbon nanotubes, if chosen, may be filled with copper nanoparticles. Similarly, the carbon nanocapsules may be filled with copper nanoparticles.

Referring to FIG. 2, the grooves 20 of the metal tube 94 (FIG. 9) provide a capillary driving force. The capillary driving force drives the working fluid 96 to a heat source (e.g., a central processing unit 98). Accordingly, the heat pipe 92 may not necessarily rely on gravity alone to move a working fluid 96 to the heat source 98. The heat pipe 92 (FIG. 9), including the metal pipe 94, may work in not only a vertical orientation but also in a horizontal or angled orientation.

In addition, the grooves 20 of the metal tube 94 increase the surface area of the inner surface 94a of the metal tube 94. This increase enhances the thermal conductivity of the heat pipe 92.

The various embodiments of the present invention may provide a thermal solution of a heat-dispatching problem. The heat-dispatching problem may stem from a usage of a high-performance notebook, a desktop PC, a high-power IC package, a plasma display panel (PDP), a semiconductor or microelectronic device, an optical device, MEMS, 3C, automobile or other vehicle or device which needs to have heat dissipated therefrom. The optical device may be an optical storage, optical display, optical communication device or electro-optical device.

Moreover, the heat pipe of the present invention may be a heat exchanger for a high speed computing device.

Furthermore, the heat pipe of the first embodiment may be applied on a product for electronic cooling.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A thermal assembly comprising:
   a metal tube having an inner surface, the inner surface being patterned so that die inner surface of the metal tube defines at least one pitch and at least two grooves separated by the pitch, each of the grooves having at least one of a depth in the range of about 10 nanometers to about 1 micrometer and an upper width in the range of about 10 nanometers to about 1 micrometer, the pitch having a width in the range of about 20 nanometers to about 1 micrometer;
   an amount of fluid sealed in the metal tube;
   a central processing unit arranged to be cooled by the amount of fluid; and
   a heat sink for cooling the amount of fluid after the amount of fluid cools the central processing unit.

2. The thermal assembly of claim 1, wherein the amount of fluid is composed of a liquid and a nano material suspended in the amount of fluid.

3. The thermal assembly of claim 2, wherein the liquid is comprised of a liquid selected from the group consisting of water, ammonia, methanol, acetone, and heptane.

4. The thermal assembly of claim 2, wherein the nano material is comprised of a material selected from the group consisting of carbon nanotubes, carbon nanocapsules and copper nanoparticles.

5. The thermal assembly of claim 1, wherein the metal tube is comprised of a metal selected from the group consisting of copper, aluminum, iron, and stainless steel.

6. The thermal assembly of claim 1, wherein each of the grooves has a groove bottom, each of the grooves forming a groove angle in the range of about 45 to about 90 degrees at the groove bottom of each of the grooves.

7. A heat pipe comprising:
   a metal tube having an inner surface, the inner surface being patterned to define at least one pitch and at least two grooves, adjacent grooves being separated by a given pitch, each of the grooves having a depth in the range of about 10 nanometers to about 1 micrometer, the pitch having a width in the range of about 20 nanometers to about 1 micrometer, the metal tube defining a central cavity surrounded by the inner surface, the central cavity fluidly communicating with the at least two grooves; and
   an amount of fluid sealed in the metal tube.

8. The heat pipe of claim 7, wherein the grooves respectively extend along the metal tube.

9. The heat pipe of claim 7, wherein the grooves are screw threads on the inner surface of the metal tube.

10. The heat pipe of claim 7, wherein the inner surface is patterned to define at least two pitches.

11. The heat pipe of claim 10, wherein the grooves and the pitches collectively encircle the amount of fluid.

12. The heat pipe of claim 7, wherein the amount of fluid is comprised of a liquid selected from the group consisting of water, ammonia, methanol, acetone and heptane.

13. The heat pipe of claim 7, wherein each of the grooves is V-shaped.

14. The heat pipe of claim 13, wherein each of the grooves has a groove bottom, each of the grooves forming a groove angle in the range of about 45 to about 90 degrees at the groove bottom of each of the grooves.

15. The heat pipe of claim 7, wherein each of the grooves has an upper width in the range of about 10 nanometers to about 1 micrometer.

16. The heat pipe of claim 7, wherein the amount of fluid farther contains a heat-conductive nano material suspended therein.

17. A thermal assembly comprising:
   a metal tube having an inner surface, the inner surface being patterned so that the inner surface of the metal tube defines at least one pitch and at least two grooves separated by the pitch, each of the grooves having at least one of a depth in the range of about 10 nanometers to about 1 micrometer and an upper width in the range of about 10 nanometers to about 1 micrometer, the pitch having a width in the range of about 20 nanometers to about 1 micrometer, the metal tube defining a central cavity surrounded by the inner surface, the central cavity fluidly communicating with the at least two grooves;

an amount of fluid sealed in the metal tube;

a central processing unit arranged to be cooled by the amount of fluid; and a heat sink for cooling the amount of fluid after the amount of fluid cools the central processing unit.

18. The thermal assembly of claim 17, wherein the amount of fluid is composed of a liquid and a nano material suspended in the amount of fluid.

19. The thermal assembly of claim 18, wherein the nano material is comprised of a material selected from the group consisting of carbon nanotubes, carbon nanocapsules and copper nanoparticles.

20. The thermal assembly of claim 17, wherein each of the grooves has a groove bottom, each of the grooves forming a groove angle in the range of about 45 to about 90 degrees at the groove bottom of each of the grooves.

* * * * *